(12) United States Patent
Koshimizu et al.

(10) Patent No.: US 8,404,137 B2
(45) Date of Patent: Mar. 26, 2013

(54) PLASMA PROCESSING APPARATUS AND PLASMA PROCESSING METHOD

(75) Inventors: Chishio Koshimizu, Nirasaki (JP); Naoki Matsumoto, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 68 days.

(21) Appl. No.: 13/014,155

(22) Filed: Jan. 26, 2011

(65) Prior Publication Data

US 2011/0114599 A1 May 19, 2011

Related U.S. Application Data

(62) Division of application No. 11/830,309, filed on Jul. 30, 2007, now abandoned.

(60) Provisional application No. 60/849,461, filed on Oct. 5, 2006.

(30) Foreign Application Priority Data

Aug. 3, 2006 (JP) .................................. 2006-211747

(51) Int. Cl.
*G01R 31/00* (2006.01)
(52) U.S. Cl. .............. 216/61; 216/59; 216/67; 438/706; 438/710; 156/345.48
(58) Field of Classification Search ............ 216/59, 216/67; 438/706, 710; 156/345.48
See application file for complete search history.

(56) References Cited

U.S. PATENT DOCUMENTS

| | | | |
|---|---|---|---|
| 5,576,629 A * | 11/1996 | Turner et al. | 324/709 |
| 6,714,033 B1 | 3/2004 | Makhratchev et al. | |
| 6,849,154 B2 * | 2/2005 | Nagahata et al. | 156/345.47 |
| 7,981,306 B2 * | 7/2011 | Blattner et al. | 216/67 |
| 2005/0051270 A1 | 3/2005 | Sasaki et al. | |
| 2005/0115677 A1 | 6/2005 | Nagahata et al. | |
| 2006/0256499 A1 * | 11/2006 | Yang et al. | 361/234 |

FOREIGN PATENT DOCUMENTS

JP 2001-127045 5/2001

* cited by examiner

*Primary Examiner* — Duy Deo
*Assistant Examiner* — Maki Angadi
(74) *Attorney, Agent, or Firm* — Oblon, Spivak, McClelland, Maier & Neustadt, L.L.P.

(57) ABSTRACT

A plasma processing apparatus includes a plurality of radio-frequency power supplies for supplying radio-frequency powers having frequencies different from each other, a common feeding line for superposing radio-frequency powers supplied respectively from the plurality of radio-frequency power supplies and feeding the superposed radio-frequency power to a same radio-frequency electrode, a radio-frequency power extracting device for extracting radio-frequency powers having predetermined frequencies from radio-frequency powers fed via the feeding line, and a radio-frequency voltage detector for measuring voltages of the radio-frequency powers having the predetermined frequencies extracted by the radio-frequency power extracting device.

4 Claims, 3 Drawing Sheets

PLASMA PROCESSING APPARATUS AND PLASMA PROCESSING METHOD

CROSS-REFERENCE TO RELATED APPLICATIONS

This application is a divisional application of U.S. application Ser. No. 11/830,309 filed Jul. 30, 2007, the entire contents of which is incorporated herein by reference. U.S. application Ser. No. 11/830,309 claims the benefit of priority under 119(e) of U.S. Provisional Application No. 60/849,461, filed Oct. 5, 2006, and claims the benefit of priority under 35 U.S.C. §119 from Japanese Patent Application No. 2006-211747 filed Aug. 3, 2006.

BACKGROUND OF THE INVENTION

1. Field of the Invention

The present invention relates to a plasma processing apparatus in which plasma is generated in a processing chamber and a substrate is processed therein, and a plasma processing method.

2. Description of the Related Art

In substrate processing such as etching and film formation in manufacturing processes of a semiconductor processing device, a liquid display device, or the like for example, processing using plasma is widely performed.

Usually, plasma processing is performed in a plasma processing apparatus. In this plasma processing apparatus, electrodes opposing each other vertically are provided in a processing chamber, in which plasma is generated by supplying a radio-frequency power to one or both of the electrodes, and then plasma processing of a substrate is performed.

In recent years, there has been developed a plasma processing technique to apply a superposed radio-frequency power to an electrode by supplying two or more radio-frequency powers having different frequencies to one electrode. In Japanese Patent Application No. 2001-127045, there is disclosed a plasma processing technique using a superposed radio-frequency power by supplying two radio-frequency powers having different frequencies to an upper electrode, where the upper electrode and a lower electrode are arranged to oppose each other.

In the plasma processing technique described in Japanese Patent Application Laid-open No. 2001-127045, a first radio-frequency power for exciting a processing gas into plasma is supplied to the upper electrode, and a second radio-frequency power having a frequency lower than that of the first radio-frequency power for drawing ions in the plasma into a substrate is supplied to the lower electrode on which the substrate is mounted. Further, a third radio-frequency power having a frequency lower than that of the first radio-frequency power and higher than that of the second radio-frequency power is supplied to the upper electrode and superposed on the first radio-frequency power. Then phases, frequencies and outputs of the second radio-frequency power and the third radio-frequency power are adjusted to uniformize the plasma, and thereby processing of the substrate is performed uniformly.

SUMMARY OF THE INVENTION

However, when a substrate is processed using the plasma processing technique described in the above-described Patent Document 1, respective peak-to-peak voltages (Vpp) of the first radio-frequency power and the third radio-frequency power supplied to the upper electrode are also superposed along with superposition of these radio-frequency powers.

When a radio-frequency power supplied to an electrode has a single frequency, a process state of substrate processing can be easily determined by following a behavior of a peak-to-peak voltage (Vpp) of the radio-frequency power. For example, when an upper electrode and a lower electrode are arranged to oppose each other, a radio-frequency power having a single frequency for exciting a processing gas into plasma is supplied to the upper electrode, and a radio-frequency power having a single frequency for drawing ions in the plasma into a substrate is supplied to the lower electrode, it is possible to determine that the plasma generated by the upper electrode became thin for some reason when a value of the peak-to-peak voltage (Vpp) of the radio-frequency power supplied to the lower electrode becomes large.

On the other hand, in the plasma processing technique described in the above-described Patent Document 1, peak-to-peak voltages (Vpp) of a plurality of radio-frequency powers are superposed as described above, and a peak-to-peak voltage (Vpp) of a radio-frequency power having a specific frequency which has useful information is mixed with a peak-to-peak voltage (Vpp) of a radio-frequency power having another frequency, thereby making it difficult to be used as an index for process determination for substrate processing.

The present invention is made in view of the above-described problems, and an object thereof is to provide a plasma processing apparatus and a plasma processing method capable of determining a process state of substrate processing from a behavior of a peak-to-peak voltage (Vpp) of a radio-frequency power having an appropriate frequency even when two or more radio-frequency powers having different frequencies are superposed and supplied to an electrode arranged in a processing chamber.

To solve the above-described problems, according to the present invention, there is provided a plasma processing apparatus having radio-frequency electrodes opposing each other vertically in a processing chamber, in which a radio-frequency power is supplied to at least one of the radio-frequency electrodes to thereby generate in the processing chamber plasma with which a substrate is processed, the apparatus having a plurality of radio-frequency power supplies for supplying radio-frequency powers having frequencies different from each other, a common feeding line for feeding radio-frequency powers supplied respectively from the plurality of radio-frequency power supplies to a same radio-frequency electrode, a radio-frequency power extracting device for extracting radio-frequency powers having predetermined frequencies from radio-frequency powers fed via the feeding line, and a radio-frequency detector for measuring at least one or more of a voltage, a current and a phase of the radio-frequency powers having the predetermined frequencies extracted by the radio-frequency power extracting device.

In the above-described plasma processing apparatus, the radio-frequency detector may be a radio-frequency voltage detector for measuring voltages of the radio-frequency powers having the predetermined frequencies.

In the above-described plasma processing apparatus, the predetermined frequencies may be frequencies of the radio-frequency powers supplied respectively by the plurality of radio-frequency power supplies.

In the above-described plasma processing apparatus, the radio-frequency power extracting device may have at least one of a band-pass filter, a low-pass filter and a high-pass filter which pass only the radio-frequency powers having the predetermined frequencies.

In the above-described plasma processing apparatus, the radio-frequency power extracting device may have a radio-frequency power decomposing device for decomposing a radio-frequency power fed via the feeding line into the radio-frequency powers having the predetermined frequencies.

In the above-described plasma processing apparatus, the plurality of radio-frequency power supplies may have matching devices respectively between the plurality of radio-frequency power supplies and the feeding line.

The above-described plasma processing apparatus may further include a direct-current voltage extracting device for extracting a direct-current voltage from a radio-frequency power fed via the feeding line, and a direct-current voltage detector for measuring the direct-current voltage extracted by the direct-current voltage extracting device.

The above-described plasma processing apparatus may further include a computer for correcting voltages of the radio-frequency powers having the predetermined frequencies measured by the radio-frequency voltage detector based on impedance information which are retained in advance or obtained, and calculating voltages of the radio-frequency powers having the predetermined frequencies at the radio-frequency electrode.

Further, according to the present invention, there is provided a plasma processing method in which a radio-frequency power is supplied to at least one of radio-frequency electrodes provided in a processing chamber and opposing each other vertically, to thereby generate in the processing chamber plasma with which a substrate is processed, the method including feeding using a common feeding line a plurality of radio-frequency powers having frequencies different from each other to a same radio-frequency electrode, extracting radio-frequency powers having predetermined frequencies, which are ones among the frequencies, from radio-frequency powers fed via the feeding line and measuring voltages thereof, and correcting the measured voltages using predetermined impedance information and calculating voltages of the radio-frequency powers having the predetermined frequencies at the same radio-frequency electrode.

In the above-described plasma processing method, when the radio-frequency powers having the predetermined frequencies are extracted, at least one of a band-pass filter, a low-pass filter and a high-pass filter which pass only the radio-frequency powers having the predetermined frequencies may be used for extraction.

In the above-described plasma processing method, when the radio-frequency powers having the predetermined frequencies are extracted, a radio-frequency power fed via the feeding line may be decomposed to the radio-frequency powers having the predetermined frequencies and extracted.

In the above-described plasma processing method, a direct-current voltage may be extracted from a radio-frequency power fed via the feeding line and the voltage may be measured.

According to the present invention, it is possible to use a peak-to-peak voltage (Vpp) of a radio-frequency power having an appropriate frequency as an index to determine a process state of substrate processing from a behavior of the peak-to-peak voltage even when two or more radio-frequency powers having different frequencies are superposed and supplied to an electrode arranged in a processing chamber, and thus operation of the plasma processing apparatus can be stabilized.

DETAILED DESCRIPTION OF THE INVENTION

Figure 1:
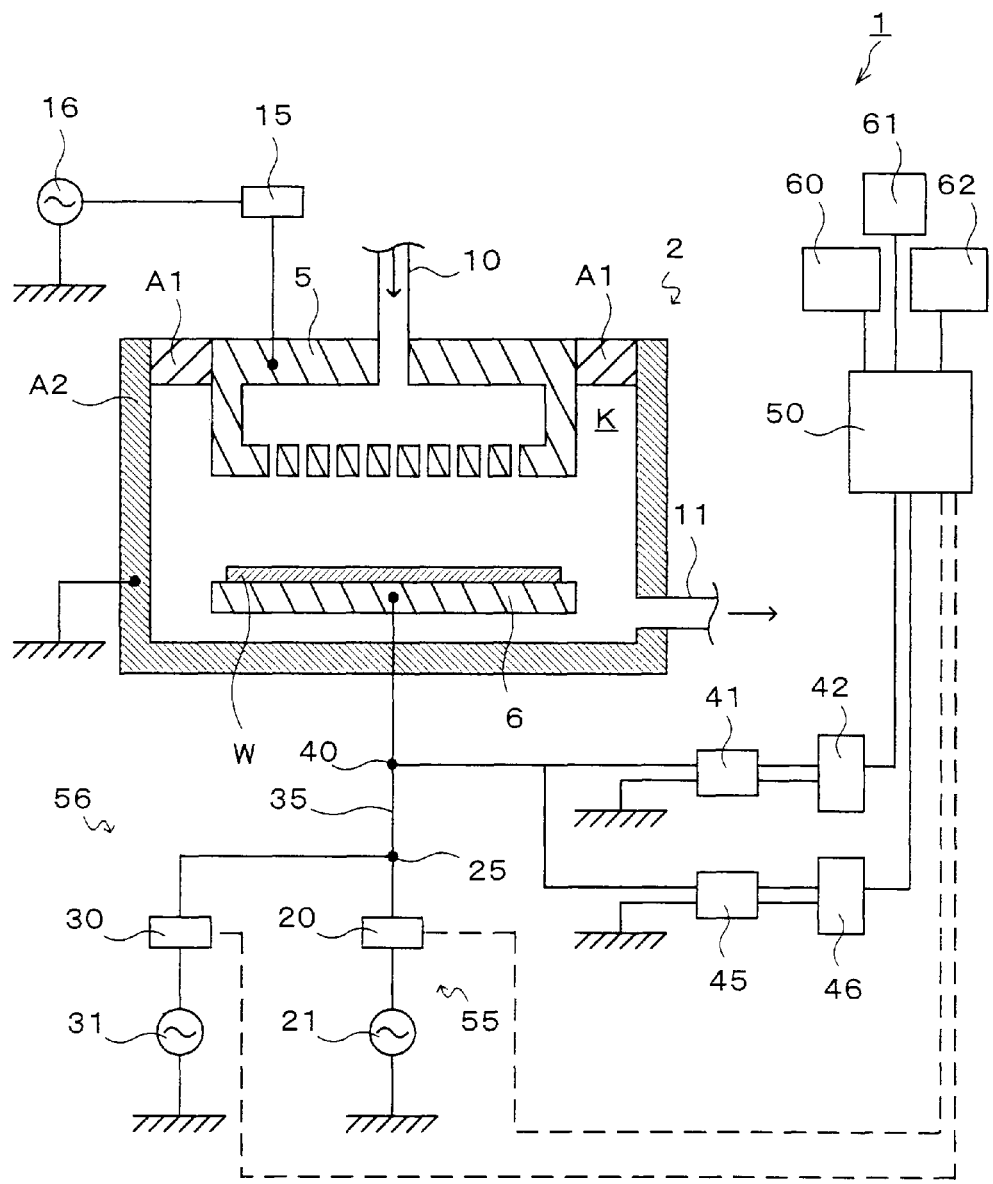
FIG. 1 is a structure diagram of a plasma etching apparatus 1 as a plasma processing apparatus according to a first embodiment of the present invention.

Hereinafter, preferred embodiments of the present invention will be described with reference to the drawings. Note that in this specification and drawings, elements having substantially the same functions and structures are designated the same reference numerals, and thereby duplicating explanations are omitted.

FIG. 1 is a structure diagram of a plasma etching apparatus 1 as a plasma processing apparatus according to an embodiment of the present invention. As shown in FIG. 1, the plasma etching apparatus 1 has a processing chamber 2 in a substantially cylindrical shape for example. Inside the processing chamber 2, a processing space K is formed. Wall portions A2 of the processing chamber 2 are grounded for protection. In the processing chamber 2, an upper electrode 5 and a lower electrode 6 as radio-frequency electrodes are arranged to oppose each other. The upper electrode 5 and the lower electrode 6 are both in a substantially disc shape and formed of a conductive material. Between the upper electrode 5 and the wall portions A2, an insulator A1 is interposed. The lower electrode 6 combines the role of a mounting table for a substrate W. In the processing space K, a processing gas is supplied via a gas supply path 10 and the upper electrode 5 which also has a function as a shower head. Further, the processing gas in the processing space K is exhausted via a gas exhaust path 11.

To the upper electrode 5, a radio-frequency power supply 16 is connected electrically via a matching device 15. The radio-frequency power supply 16 can supply a radio-frequency power having a frequency of 60 MHz for example to the upper electrode 5. The matching device 15 can control an impedance related to a fundamental wave, a harmonic or the like of a radio-frequency power for example.

To the lower electrode 6, a radio-frequency power supply 21 for supplying a radio-frequency power having a frequency of 2 MHz for example via a matching device 20 is connected electrically. Further, to a feeding point 25 located between the lower electrode 6 and the matching device 20, a radio-frequency power supply 31 for supplying a radio-frequency power having a frequency of 13 MHz for example via a matching device 30 is connected electrically. Accordingly, the radio-frequency power supplied from the radio-frequency power supply 21 and the radio-frequency power supplied from the radio-frequency power supply 31 are superposed with each other on a common feeding line 35 from the feeding point 25 to the lower electrode 6, and the superposed radio-frequency power is fed to the lower electrode 6. The matching devices 20, 30 can control an impedance with respect to a fundamental wave, a harmonic, or the like of a radio-frequency power for example.

To a measurement point 40 on the feeding line 35, a radio-frequency voltage detector 42 as a radio-frequency detector is connected via a low-pass filter 41 as a radio-frequency power extracting device which passes only a radio-frequency power having a frequency lower than a predetermined threshold frequency. Also, to the measurement point 40, a radio-frequency voltage detector 46 is connected via a high-pass filter 45 as a radio-frequency power extracting device which passes only a radio-frequency power having a frequency higher than a predetermined threshold frequency. The radio-frequency voltage detectors 42, 46 are connected to the measurement point 40 in parallel with each other. To the radio-frequency voltage detectors 42, 46, a computer 50, which will be described later, for analyzing voltages measured by the radio-frequency voltage detectors 42, 46 is connected.

The threshold frequencies of the low-pass filter 41 and the high-pass filter 45 are both set to a value larger than the frequency of 2 MHz of the radio-frequency power supplied by the radio-frequency power supply 21 and lower than the frequency of 13 MHz of the radio-frequency power supplied by the radio-frequency power supply 31. Thus, using the low-pass filter 41, a radio-frequency power having a frequency of 2 MHz which is the same as the radio-frequency power supplied by the radio-frequency power supply 21 can be extracted from the superposed radio-frequency power, and a voltage thereof can be measured by the radio-frequency voltage detector 42. Also, using the high-pass filter 45, a radio-frequency power having a frequency of 13 MHz which is the same as the radio-frequency power supplied by the radio-frequency power supply 31 can be extracted from the superposed radio-frequency power, and a voltage thereof can be measured by the radio-frequency voltage detector 46.

The computer 50 is connector to the matching devices 20, 30. Thus the computer 50 can obtain values of variable capacitors in the matching devices 20, 30 as impedance information. Also, the computer 50 retains in advance impedance information related to a first radio-frequency system 55 constituted of the radio-frequency power supply 21, the lower electrode 6, and so on and impedance information related to a second radio-frequency system 56 constituted of the radio-frequency power supply 31, the lower electrode 6, and so on. These impedance information include an impedance value of the lower electrode 6, and so on. The computer 50 can calculate an impedance value of the first radio-frequency system 55 and an impedance value of the second radio-frequency system 56 respectively based on the impedance information which is retained in advance or obtained as described above.

Further, the computer 50 can correct the voltage measured by the radio-frequency voltage detector 42 based on the calculated impedance value of the first radio-frequency system 55, and calculate the voltage of the radio-frequency power having a frequency of 2 MHz in the lower electrode 6. Similarly, the computer 50 can correct the voltage measured by the radio-frequency voltage detector 46 based on the calculated impedance value of the second radio-frequency system 56, and calculate the voltage of the radio-frequency power having a frequency of 13 MHz in the lower electrode 6. To the computer 50, there are connected a display 60 displaying values of the radio-frequency powers having frequencies of 2 MHz, 13 MHz in the lower electrode 6 calculated in this manner, a recording device 61 for recording the values and a higher system 62 for performing analysis and the like.

Next, using the plasma etching apparatus 1 constructed as above, a plasma etching method for a substrate W as an example of a plasma processing method according to an embodiment of the present invention will be explained.

First, the substrate W is carried into the processing chamber 2 and mounted on the lower electrode 6. Exhaustion is performed through the exhaust path 11, the inside of the processing chamber 2 is decompressed, and a predetermined processing gas is supplied to the processing chamber 2 via the upper electrode 5 from the gas supply path 10.

Next, the radio-frequency power supply 16 supplies to the upper electrode 5 a radio-frequency power having a frequency of 60 MHz for generating plasma. Thus the processing gas in the processing space K is excited into plasma. Next, the radio-frequency power supply 21 of the first radio-frequency system 55 supplies to the lower electrode 6 a radio-frequency power having a frequency of 2 MHz and ions in the generated plasma are drawn into the substrate W, and thereby a surface film of the substrate W is etched. Further, the radio-frequency power supply 31 of the second radio-frequency system 56 supplies to the lower electrode 6 a radio-frequency power having a frequency of 13 MHz, and as a result, a superposed radio-frequency power in which the radio-frequency power having a frequency of 2 MHz and the radio-frequency power having a frequency of 13 MHz are superposed is supplied to the lower electrode 6 via the feeding line 35. Note that there is an advantage that spreading of energy of the ions entering the substrate W is aligned by supplying the radio-frequency power having a frequency of 13 MHz by the radio-frequency power supply 31 of the second radio-frequency system 56.

When the surface film of the substrate W is etched as described above, a voltage of the superposed radio-frequency power supplied to the lower electrode 6 is measured by the radio-frequency voltage detector 42 connected via the low-pass filter 41 and the radio-frequency voltage detector 46 connected via the high-pass filter 45, respectively. From the superposed radio-frequency power passed through the low-pass filter 41, only the radio-frequency power having a frequency of 2 MHz is extracted, and a voltage $V_1$ thereof is measured. From the superposed radio-frequency power passed through the high-pass filter 45, only the radio-frequency power having a frequency of 13 MHz is extracted, and a voltage $V_2$ thereof is measured.

The measured voltages $V_1$, $V_2$ are inputted to the computer 50. In the computer 50, respective values of the variable capacitors in the connected matching devices 20, 30 are obtained, and based on impedance information and so on of the lower electrode 6 retained in advance, impedances of the first radio-frequency system 55 and the second radio-frequency system 56 are calculated in advance. Then, in the computer 50, the measured values of the voltages $V_1$, $V_2$ are corrected respectively based on the calculated impedances of the first radio-frequency system 55 and the second radio-frequency system 56, and the voltages $V_{10}$, $V_{20}$ of the radio-frequency powers having frequencies of 2 MHz, 13 MHz in the lower electrode 6 are calculated respectively. The calculated voltages $V_{10}$, $V_{20}$ are inputted to the display 60 and displayed thereon so that an operator can monitor behaviors of them. Thus, the operator can comprehend the progress of the process of the substrate W from the behaviors (for example respective peak-to-peak voltages Vpp or the like) of the voltages $V_{10}$, $V_{20}$ displayed for example, and detect abnormality of the process immediately.

Also, the calculated voltages $V_{10}$, $V_{20}$ are inputted to the recording device 61 and recorded therein. Further, the calculated voltages $V_{10}$, $V_{20}$ are inputted to the higher system 62, and in this higher system 62, respective peak-to-peak voltages Vpp are calculated. Based on changes in the calculated peak-to-peak voltages Vpp, analysis of a process state is performed such as whether the plasma etching processing of the substrate W is in a normal state or not.

According to the above embodiment, when the superposed radio-frequency power in which the two radio-frequency powers having different frequencies of 2 MHz, 13 MHz are superposed is supplied to the lower electrode 6, the radio-frequency powers having respective frequencies of 2 MHz, 13 MHz are extracted by passing through the low-pass filter 41 and the high-pass filter 45, and then the voltages of the respective extracted radio-frequency powers are measured. Thus, behaviors of the peak-to-peak voltages Vpp of the respective radio-frequency powers can be comprehended, and the process state of the substrate processing can be determined properly. Particularly, with the computer 50 arranged to calculate impedances of the respective radio-frequency systems 55, 56, make correction based on these impedances, and calculate voltages of the respective radio-frequency powers in the lower electrode 6, the process of the plasma processing apparatus can be comprehended more accurately. Therefore, operation of the plasma processing apparatus can be stabilized.

Figure 2:
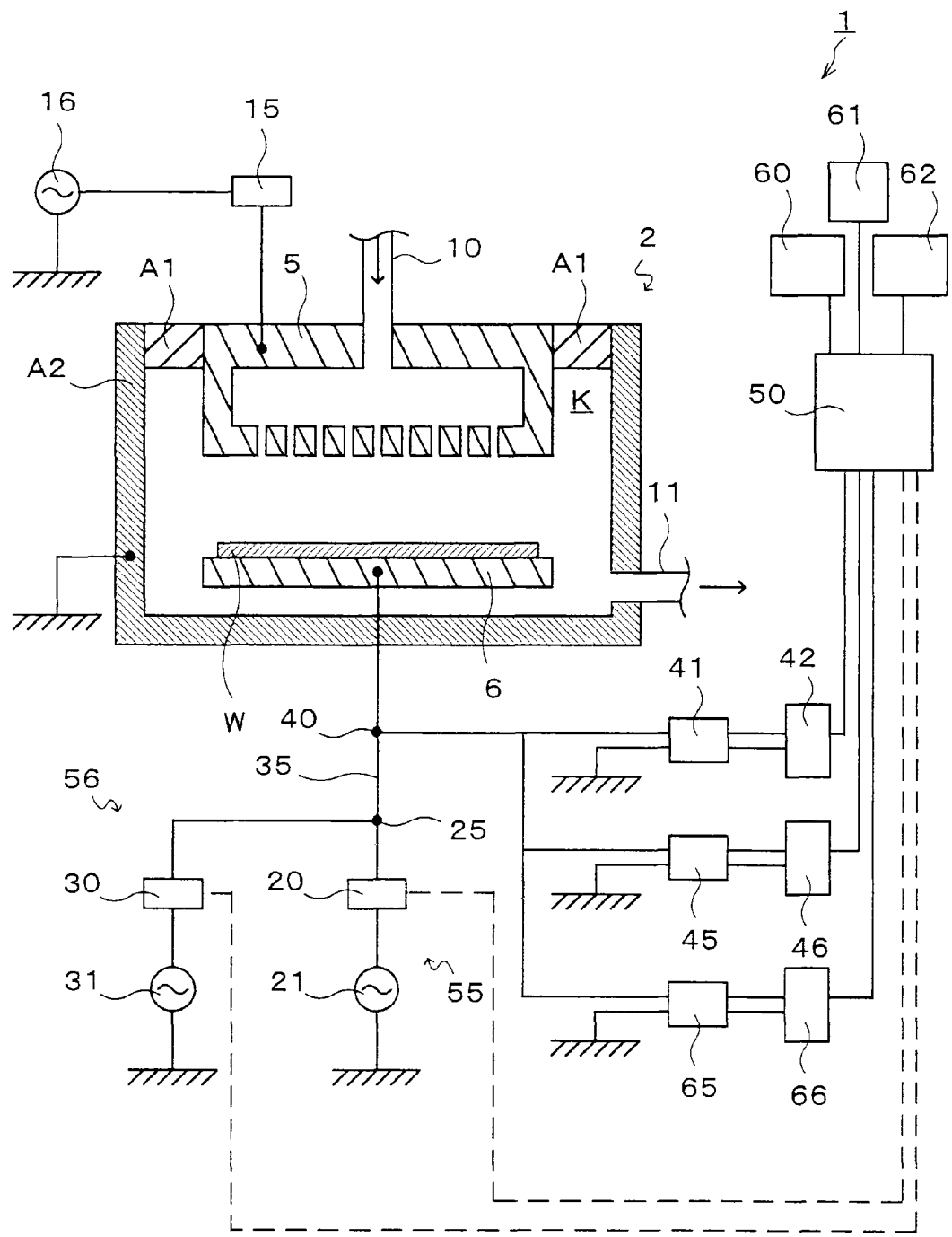
FIG. 2 is a structure diagram of a plasma etching apparatus 1 as a plasma processing apparatus according to a second embodiment of the present invention.

As a second embodiment of the present invention, as shown in FIG. 2, to the measurement point 40 on the feeding line 35, a direct-current voltage detector 66 may be connected via a low-pass filter 65 as a direct-current voltage extracting device which eliminates radio-frequency components and passes only a direct-current voltage in parallel to the radio-frequency voltage detectors 42, 46. Further, the direct-current voltage detector 66 is connected to the computer 50.

According to the second embodiment as above, a direct-current voltage can be extracted using the low-pass filter 65 from the superposed radio-frequency power supplied to the lower electrode 6 by the radio-frequency power supplies 21, 31, and a direct-current bias voltage Vdc in the lower electrode 6 can be measured. A behavior of this direct-current bias voltage Vdc can be followed. For example, after a measured value of the direct-current bias voltage Vdc is inputted to the computer 50 and necessary processing is performed thereon, the value can be inputted to the display 60 and displayed thereon, inputted to the recording device 61 and recorded therein, or inputted to the higher system 62 and analyzed. Thus, the process of the plasma processing apparatus can be comprehended more accurately, and operation of the plasma processing apparatus can be stabilized further. Note that also in the second embodiment, the effect obtained in the first embodiment, which is explained using FIG. 1, can be obtained similarly.

Figure 3:
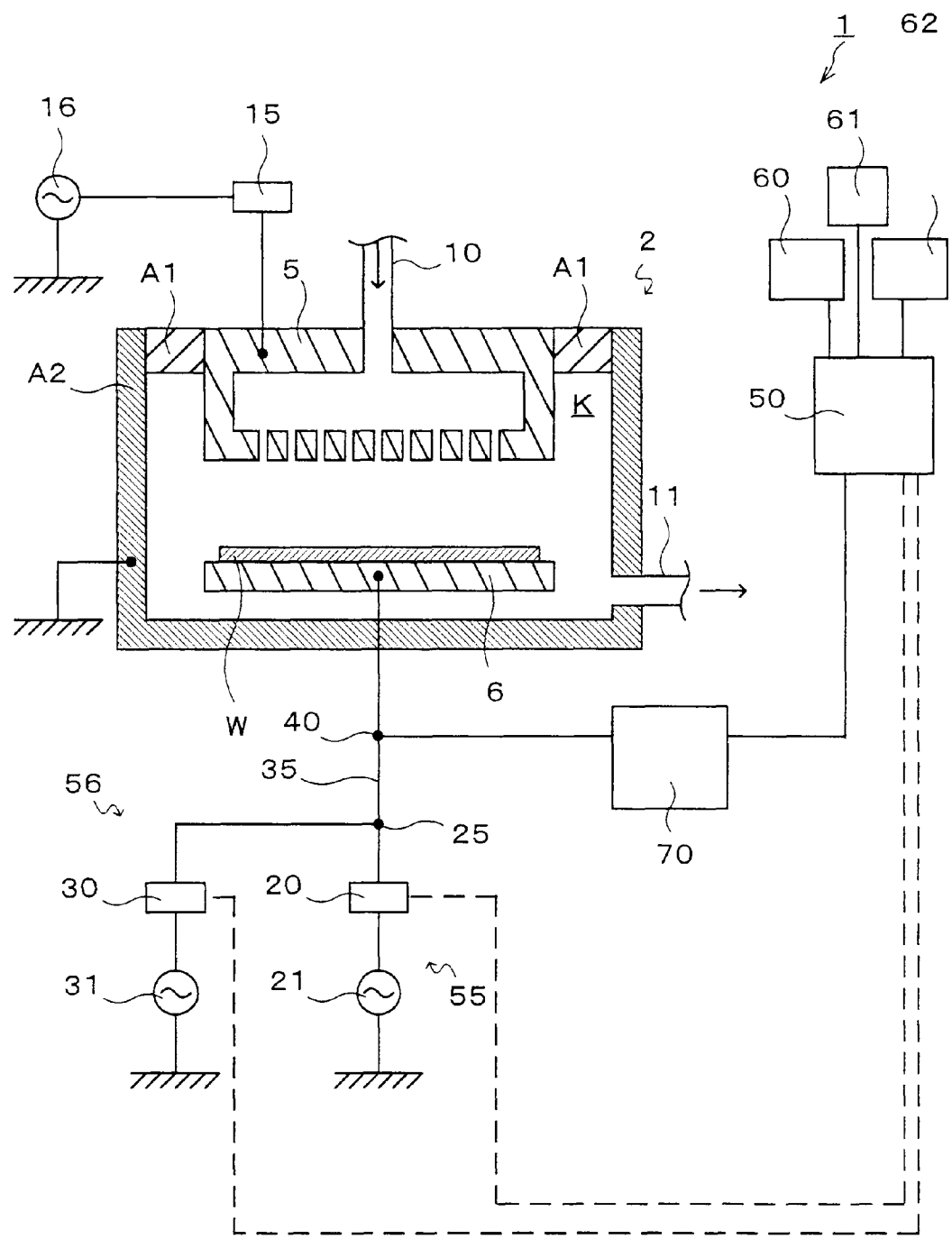
FIG. 3 is a structure diagram of a plasma etching apparatus 1 as a plasma processing apparatus according to a third embodiment of the present invention.

As a third embodiment of the present invention, as shown in FIG. 3, instead of the low-pass filter 41 and the high-pass filter 45 shown in FIG. 1, a radio-frequency power decomposing device 70 may be connected to the measurement point 40 on the feeding line 35 as a radio-frequency power extracting device. The radio-frequency power decomposing device 70 can decompose the superposed radio-frequency power to obtain values of respective components of the radio-frequency powers having frequencies of 2 MHz, 13 MHz. After obtaining respective voltages from the respective decomposed radio-frequency powers, the radio-frequency power decomposing device 70 is configured to input the voltages to each of the connected display 60, the recording device 61 and the higher system 62 which are connected. Thus, displaying on the display 60, recording in the recording device 61, or analyzing in the higher system 62 can be performed. In this embodiment, peak-to-peak voltages and so on of the respective radio-frequency powers are obtained by the radio-frequency power decomposing device 70. Note that the higher system 62 may be arranged to obtain the peak-to-peak voltages and so on of the obtained respective radio-frequency powers.

According to the third embodiment of the present invention, the superposed radio-frequency power in which radio-frequency powers supplied by the radio-frequency power supplies 21, 31 are superposed can be decomposed by the radio-frequency power decomposing device 70, and in the radio-frequency power decomposing device 70 subsequently, the peak-to-peak voltages and so on can be obtained from the voltages of the respective radio-frequency powers. Thus, the structure of the apparatus can be simplified. Note that also in the third embodiment, the effect obtained in the first embodiment, which is explained with FIG. 1, can be obtained similarly.

As above, the preferred embodiments of the present invention have been explained with reference to the attached drawings, but the present invention is not limited to such examples. It is clear that a person skilled in the art can devise various variation examples and modification examples within the scope of technical ideas described in the claims, and it is understood that such changes and modifications also belong to the technical scope of the present invention as a matter of course.

In the above-described embodiments, there is explained the case where the single low-pass filter 41 and the single high-pass filter 45 are used as the radio-frequency power extracting device, but a plurality of low-pass filters and a plurality of high-pass filters may be used as the radio-frequency power extracting device. Also, these filters may be combined, or another filter such as a band-pass filter may be used.

In the above-described embodiments, there is explained the case where the radio-frequency electrode to which the superposed radio-frequency power in which a plurality of radio-frequency powers are superposed is supplied is the lower electrode 6, but the radio-frequency electrode to which the superposed radio-frequency power is supplied may be the upper electrode 5, or may be both the upper electrode 5 and the lower electrode 6. Also, the apparatus may be constructed such that a radio-frequency power for generating plasma and a radio-frequency power for drawing ions are superposed for the lower electrode 6, and a radio-frequency power is not applied to the upper electrode 5.

In the above-described embodiments, there is explained the case where two radio-frequency powers having different frequencies are supplied to the lower electrode 6 as a radio-frequency electrode, but there may be three or more radio-frequency powers supplied to the radio-frequency electrode.

In the above-described embodiments, there is explained the case where the frequency of the radio-frequency power supplied to the upper electrode 5 is 60 MHz, and the frequencies of the radio-frequency powers supplied to the lower electrode 6 are 2 MHz and 13 MHz, but the frequency of a radio-frequency power supplied to each radio-frequency electrode may be any frequency.

In the above-described embodiments, there is explained the case where devices connected to the computer 50 or the radio-frequency power decomposing device 70 so as to process values of voltages of respective radio-frequency powers having respective frequencies or direct-current voltages obtained from the superposed radio-frequency power are the display 60, the recording device 61 and the higher system 62, but devices for processing values of voltages of respective radio-frequency powers or direct-current voltages may be only a part of these devices or may be another device.

In the above-described embodiments, there is explained the case where the radio-frequency voltage detector with an intervention of the radio-frequency power extracting device is used as a radio-frequency detector to detect a radio-frequency voltage, but there may be adopted a form in which a detector for detecting respective radio-frequency current and/or phase is used as a radio-frequency detector to finally comprehend plasma in a plasma processing apparatus.

In the above-described embodiments, there is explained the case where the superposed radio-frequency power is actually decomposed using the radio-frequency power decomposing device 70 to obtain respective radio-frequency powers, but the respective radio-frequency powers may be obtained by analysis without actually decomposing the superposed radio-frequency power in the radio-frequency power decomposing device 70.

The present invention is useful for plasma processing equipment for a substrate for example, and particularly useful for plasma etching equipment for plasma etching a substrate.

What is claimed is:

1. A plasma processing method in which a radio-frequency power is supplied to at least one of radio-frequency electrodes provided in a processing chamber and opposing each other vertically, to thereby generate in the processing chamber plasma with which a substrate is processed, the method comprising:

feeding using a common feeding line a plurality of radio-frequency powers having frequencies different from each other to a same radio-frequency electrode;

extracting radio-frequency powers having predetermined frequencies, which are ones among the frequencies, from radio-frequency powers fed via the feeding line and measuring voltages thereof;

retaining in advance impedance information related to respective radio-frequency systems constituted of the plurality of radio-frequency powers and the same radio-frequency electrode; and correcting the measured voltages using predetermined impedance information which are retained in advance or obtained and calculating voltages of the radio-frequency powers having the predetermined frequencies at the same radio-frequency electrode, to thereby comprehend the progress of a process of the substrate.

2. The plasma processing method according to claim 1, wherein when the radio-frequency powers having the predetermined frequencies are extracted, at least one of a band-pass filter, a low-pass filter and a high-pass filter which pass only the radio-frequency powers having the predetermined frequencies is used for extraction.

3. The plasma processing method according to claim 1, wherein when the radio-frequency powers having the predetermined frequencies are extracted, a radio-frequency power fed via the feeding line is decomposed to the radio-frequency powers having the predetermined frequencies and extracted.

4. The plasma processing method according to claim 1, wherein a direct-current voltage is extracted from a radio-frequency power fed via the feeding line and the voltage may be measured.

* * * * *